United States Patent [19]
Bien

[11] Patent Number: 5,170,134
[45] Date of Patent: Dec. 8, 1992

[54] FAST BUFFER

[75] Inventor: David E. Bien, Sunnyvale, Calif.

[73] Assignee: SGS-Thomson Microelectronics, Inc., Carrollton, Tex.

[21] Appl. No.: 713,800

[22] Filed: Jun. 12, 1991

[51] Int. Cl.⁵ .......................... H03F 3/45; H03F 3/26
[52] U.S. Cl. ...................... 330/255; 330/85; 330/300
[58] Field of Search ............... 330/69, 85, 252, 253, 330/255, 260, 277, 300, 311, 146

[56] References Cited

U.S. PATENT DOCUMENTS

| 4,571,553 | 2/1986 | Yokoyama | 330/85 |
| 4,954,769 | 9/1990 | Kaltoff | 330/260 X |
| 5,003,269 | 3/1991 | Lehmann | 330/267 |

FOREIGN PATENT DOCUMENTS 0035543  3/1980  Japan .................. 330/300

Primary Examiner—Steven Mottola
Attorney, Agent, or Firm—Richard A. Bachand; Lisa K. Jorgenson; Richard K. Robinson

[57] ABSTRACT

A buffer circuit includes an input amplifier connected to receive an input signal and an output amplifier connected provide an output signal. A differential amplifier is connected to also receive the input and output signals and to provide an output related to the difference between the signals to maintain a desired relationship between the input and output signals. The buffer circuit can be configured so that the signal from the differential amplifier is provided either to the input or the output amplifier, and can be accomplished in either bipolar or BICMOS technologies. The combination of the open loop and differential type buffer amplifiers, retains the best features of both, with the excellent speed performance of the open loop circuit as well as the enhanced accuracy of the differential amplifier circuit.

17 Claims, 2 Drawing Sheets

FAST BUFFER

BACKGROUND OF THE INVENTION

1. Field of the Invention

This invention relates to improvements in buffer circuits, and more particularly to improvements in open loop type emitter follower and operational, or differential, amplifier types of buffer circuits.

2. Description of the Prior Art

Buffer amplifiers have wide applications, for example, to isolate signal paths, to insure proper signal levels from one stage to another, and so on. One widely used buffer circuit 5 is shown in FIG. 1. The circuit 5 of FIG. 1 is a so called "diamond configuration" buffer circuit, and includes two emitter follower input stages 10 and 11 and one output amplifier stage 12. The first emitter follower emitter stage 10 includes an NPN transistor 15 and a current source 16 in series with its emitter. Likewise, the second emitter follower circuit 11 includes a PNP transistor 18 with a current source 19 in series with its emitter. The output amplifier stage 12 includes an NPN transistor 21 and a PNP transistor 22, connected with their emitter-collector paths in series, as shown. The input signal to the circuit, denoted $V_{IN}$ is connected to the bases of the NPN transistor 15 and the PNP transistor 18, and the output of the circuit, denoted $V_{OUT}$ is derived at an output node connection between the emitters of the NPN transistor 21 and the PNP transistor 22.

It can be seen that the buffer circuit 5 of FIG. 1 is an "open loop" amplifier, that is, it has its input signal directed to the output node with little delay or phase shift, with essentially no signal feedback. The circuit 5 is therefore relatively fast, has wide bandwidth performance, and has a good slew rate. Such circuits, however, nevertheless generally suffer from offset problems, and, since these circuits generally have very low output impedances, their output devices are usually required to be biased at very high currents.

Another type of buffer which is widely used is the "operational amplifier" or "differential amplifier" type buffer circuit 25, as shown in FIG. 2. As shown, the circuit 25 includes an operational amplifier 26 having a feedback path 27 connected between the output, $V_{OUT}$ and the negative, or inverting, input terminals. The input signal, $V_{IN}$ is connected to the positive, or non-inverting, input terminal of the operational amplifier 26.

In comparison with the "diamond configuration" buffer of the type shown in FIG. 1, the operational amplifier buffer of the type illustrated in FIG. 2 has excellent precision with low offset and low output impedance. Operational amplifier type buffers rely on the high gain of the operational amplifier to produce a good replica of $V_{IN}$ at their outputs. The drawback is that the operational amplifier must have usable gain over the entire desired frequency range of the buffer. Since, in practice, operational amplifier buffers often have a buffer similar to the above described open loop buffer as its output in a two stage arrangement with a feedback loop closed around the operational amplifier, the operational amplifier will necessarily be slower than the open loop type buffer.

SUMMARY OF THE INVENTION

In accordance with one embodiment of the present invention, a buffer circuit is presented in which an operational amplifier is used in combination with an open loop type amplifier in such a manner that the operational amplifier controls the signal from within the open loop amplifier, without detracting from the advantages inherent in the open loop amplifier. The combination, therefore, combines the best features of both the open loop amplifier and the operational amplifier type buffers. The resulting buffer circuit has the benefits of both, the excellent speed performance of the open loop circuit, and the enhanced accuracy of the operational amplifier type circuit.

One of the benefits of the buffer of the present invention is that an added feedback path is not required to provide gain over the full bandwidth of the buffer. Stated another way, the bandwidth of the amplifier is not limited by the bandwidth of the operational amplifier portion of the circuit. For instance, the required gain of the operational amplifier may need only have a small bandwidth, if all that is to be desired is increased dc performance. Moreover, it is believed that buffers fabricated according to the present invention are more tolerant of highly capacitive loads than, for example, operational amplifier buffers alone.

As will become apparent, the concepts of a preferred embodiment of the invention lend themselves well to different forms of realization; for example, the circuit can be fabricated in field effect transistor (FET), bipolar transistor, or a combination of bipolar and field effect transistor technologies, with accompanying advantages of each. For example, a BICMOS embodiment can be used in conjunction with sensitive capacitive input circuits which can be accommodated easily by FET devices, together with output circuits which require relatively large drive currents, which can be provided by bipolar devices.

Thus, in accordance with a broad aspect of the invention, a buffer circuit is provided which includes an input amplifier connected to receive an input signal and an output amplifier connected provide an output signal. A differential amplifier is connected to also receive the input and output signals to provide an output related to the difference between the input and output signals connected to maintain a desired relationship between the input and output signals. The buffer circuit can be configured so that the output signal from the differential amplifier is provided either to the input or the output amplifier, and can be accomplished in either bipolar or BICMOS technologies.

BRIEF DESCRIPTION OF THE DRAWINGS

The invention is illustrated in the accompanying drawing, in which.

In the various figures of the drawing, like reference numerals are used to denote like or similar parts.

DETAILED DESCRIPTION OF THE PREFERRED EMBODIMENTS

In accordance with one embodiment of the present invention, it has been found that by adding a feedback circuit around an open loop type buffer, its performance can be improved. Moreover, the buffer can have reduced offset, as well as a lower output impedance. In the circuit according to the invention, an extra shunt-series feedback loop is introduced in such a way that the wide unity gain bandwidth of the open loop type input amplifier can be used to amplify signals unimpaired by a gain roll-off in the added feedback path. In this way it is possible to improve the accuracy of the buffer while maintaining an extremely wide bandwidth.

Figure 1:
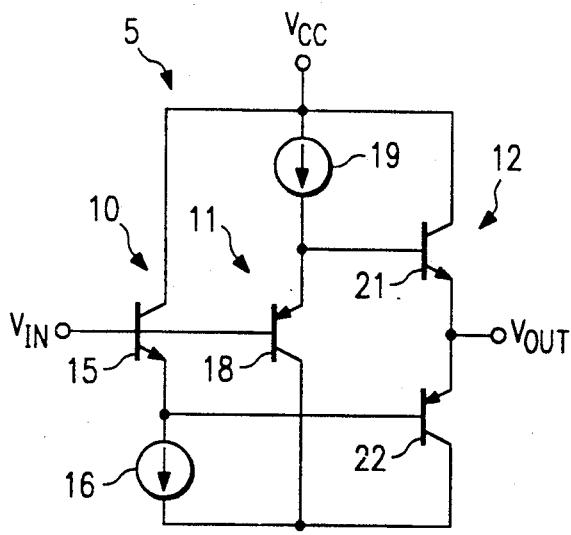
FIG. 1 is an electrical schematic diagram of an open loop, or "diamond configuration" buffer amplifier of the prior art.
Figure 2:
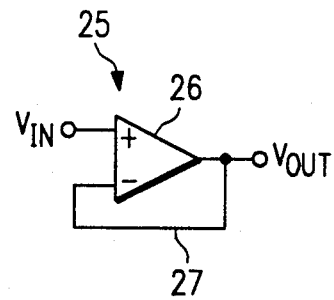
FIG. 2 is an electrical schematic diagram of an operational amplifier feedback type buffer amplifier of the prior art.
Figure 3:
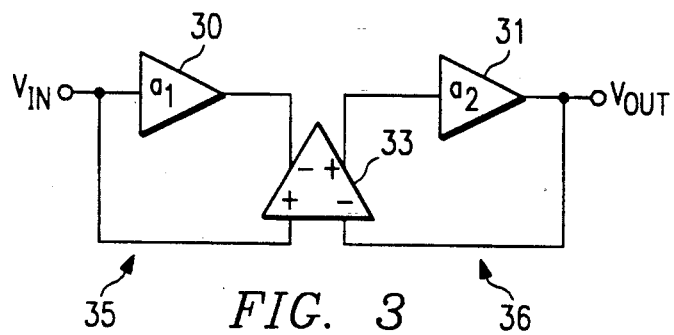
FIG. 3 is an electrical schematic and block diagram of a buffer amplifier, illustrating the principles of the present invention.

Conceptually, as shown in FIG. 3, the buffer circuit, in accordance with an embodiment of the invention has an input amplifier 30 and an output amplifier 31. A differential input/output gain block 33 is provided, together with an input loop 35 and output loop 36. The input loop 35 includes the input amplifier 30, having a gain of $a_1$, having $V_{IN}$ on its input. The input signal, $V_{IN}$ is connected to a non-inverting input terminal of the differential input/out gain block 33, and the output of the amplifier is connected to an inverting terminal of the differential input/out gain block 33.

On the other hand, the output current loop 36 is connected with the output of the amplifier 31, which has a gain of $a_2$, delivering the output signal, $V_{OUT}$. The output of the amplifier 31 is also connected to an inverting input of the differential input/out gain block 33. A non-inverting output of the differential input/out gain block 33 is connected to the input of the amplifier 31 to complete the current path.

The differential input/out gain block 33 has a transfer function which serves to maintain equality, or other desired relationship, between the input signal, $V_{IN}$, and the output signal, $V_{OUT}$.

Figure 4:
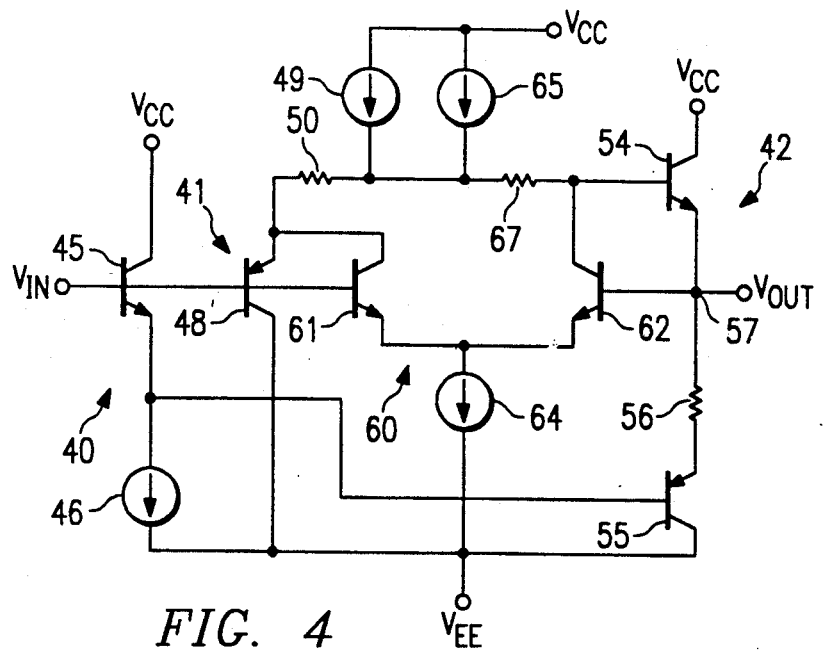
FIG. 4 is an electrical schematic diagram of a buffer amplifier, according to a preferred embodiment of the present invention, fabricated with bipolar transistors.

One manner in which this circuit can be realized in bipolar transistors is illustrated in FIG. 4. Thus, the "diamond configuration" amplifier will be realized in the form of two emitter follower input amplifiers, 40 and 41, and an output amplifier 42. The first input amplifier 40 has an NPN transistor 45 with a collector-emitter path connected in series between $V_{CC}$ and a current source 46, to $V_{EE}$. The second input amplifier 41 includes an PNP transistor 48, having an emitter-collector path connected in series with a current source 49 and resistor 50, between $V_{CC}$ and $V_{EE}$. The current sources 46 and 49 each provide a current $I_1$.

The output amplifier 42 includes an NPN transistor 54 and a PNP transistor 55, having their emitter collector paths connected in series between $V_{CC}$ and $V_{EE}$, as shown. A resistor 56 may be provided to provide a voltage drop between the output node 57 and the emitter of the transistor 55, if needed. As shown, the input signal $V_{IN}$ is connected to the bases of input transistors 45 and 48, and the output signal, $V_{OUT}$, is derived at the node 57 of the output amplifier 42. The inputs to the bases of the output transistors 54 and 55 are from the outputs of respective emitter follower input amplifiers 41 and 40, as below described.

The function of the differential input/out gain block is provided by a differential pair amplifier 60. The differential pair amplifier 60 includes two NPN transistors 61 and 62. The NPN transistor 61 has its collector-emitter path connected between the output of emitter follower amplifier 41 and a current source 64. On the other hand, the NPN transistor 62 has its collector-emitter path connected between the input of one of the output transistors, such as the base of transistor 54, as shown, and the current source 64. A second current source 65 is provided to supply current to the differential pair transistors 61 and 62 via resistors 50 and 67. The input signal, $V_{IN}$, is connected to the base of the first differential pair transistor 61, and the output node 57 is connected to the base of the second differential pair transistor 62. The current sources 64 and 65 each provide a current $I_2$.

In operation, as mentioned, transistors 45, 48, 54 and 55 function as a "diamond configuration" buffer. The differential pair transistors 61 and 62 amplify the difference between the input and output signals, $V_{IN}$ and $V_{OUT}$, and the amplified difference is summed into the circuit at the base of the transistor 54. This has the effect of reducing any differences between $V_{OUT}$ and $V_{IN}$. As mentioned, a resistor 56 may be used to allow the transistors 61 and 62 to influence $V_{OUT}$ without causing large changes in the bias currents of the transistors 54 and 55. It will be appreciated that the gain of the differential power stage can approach zero, and wide band signal paths still exists to $V_{OUT}$.

It Will be appreciated that the bipolar embodiment of the invention has been described with respect to certain NPN and PNP type transistors; however, it is not intended to limit the invention to constructions with transistors only of the conductivity types illustrated, as those skilled in the art can easily substitute transistors of different conductivity types, with appropriate changes in the biasing voltages.

Figure 5:
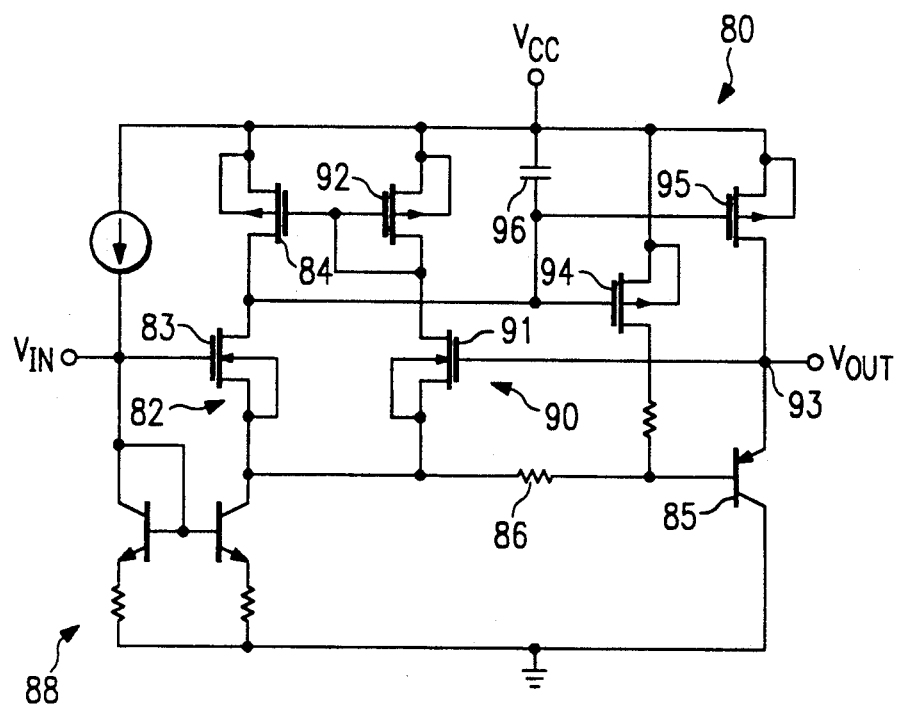
FIG. 5 is an electrical schematic diagram of a BICMOS buffer amplifier, according to another preferred embodiment of the present invention, illustrating feedback to control the output amplifier devices.

Moreover, the invention can be realized in circuits other than those fabricated only with bipolar devices, depending upon the desired application. For example, in environments in which an input signal is derived from a capacitive device without unduly discharging the capacitor, an BICMOS embodiment such as illustrated in FIG. 5 may be used. The circuit 80 shown can be realized, for example in BICMOS type processes known in the art.

The circuit 80 of FIG. 5 includes an FET input amplifier stage 82, including an n-channel transistor 83 and a p-channel transistor 84. The input signal $V_{IN}$ is applied to the gate of the n-channel transistor 83, thereby providing a high impedance input to the circuit 80. The output on the source of the transistor 83 is connected to the base of a PNP output transistor 85, via a resistor 86, thereby enabling a high current output capability for the circuit 80. The signal developed on the drain of the transistor 83 is also connected to the gates of p-channel transistors 94 and 95. A capacitor 96 is connected between $V_{CC}$ and the gate of the transistor 94 to provide capacitor compensation, as needed, for the differential feed back amplifier. Bias for the FET circuit is provided by the NPN transistor network 88.

On the other hand, an amplifier 90 including an n-channel transistor 91 and p-channel transistor 92 is connected to receive the output voltage from the output node 93 onto the gate of the transistor 91. It can be seen therefore, that the input and output signal receiving amplifiers 82 and 90 serve together with the transistor 94 to develop a signal difference between the input and output signals across the resistor 86 for application to the base of the output PNP transistor 85 to function in the same manner as the bipolar embodiment above described. It should be noted that in the circuit embodiment of FIG. 5, a signal path from input to output is directly provided through only two transistor devices, transistors 83 and 85. Therefore, the speed, bandwidth, and slew rate of the circuit is maintained in a manner similar to that of an open loop amplifier circuit alone.

Figure 6:
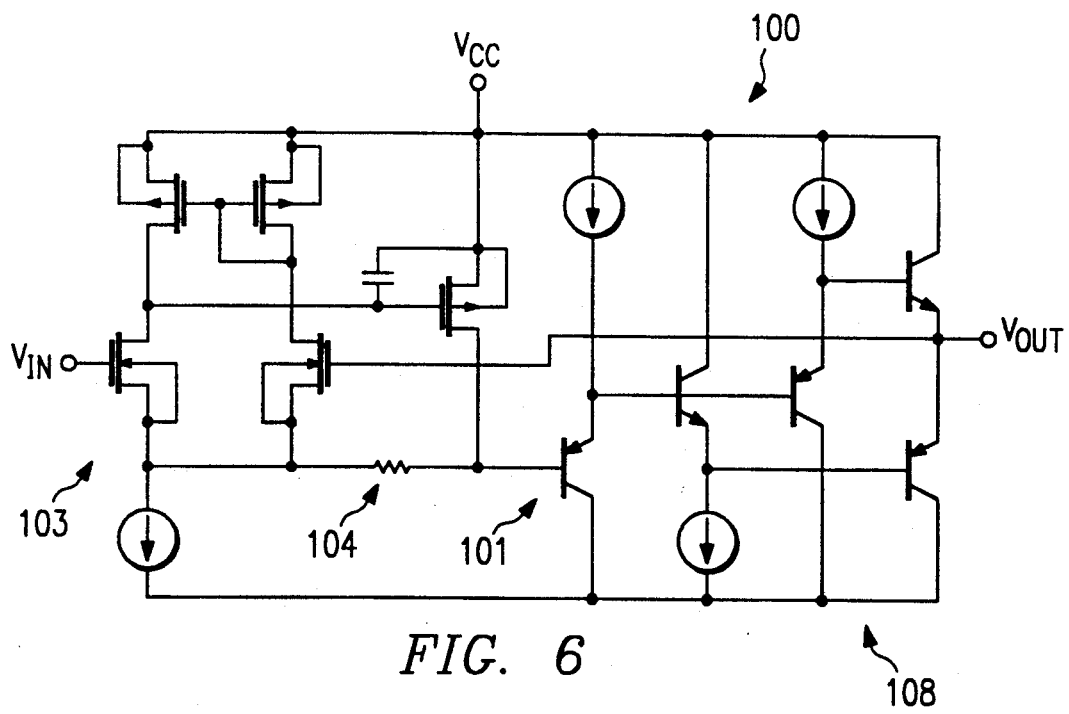
FIG. 6 is an electrical schematic diagram of a BICMOS buffer amplifier, in accordance with still another preferred embodiment of the present invention, illustrating feedback to control the input amplifier devices.

Another preferred embodiment of the present invention is illustrated in FIG. 6. Again, the circuit 100 of FIG. 6 can be realized using BICMOS technologies known in the art to achieve similar advantages as those described above in respect to the embodiment of FIG. 5. The primary difference between the circuits of FIGS. 5 and 6 is in the provision of an additional bipolar emitter follower amplifier circuit 101 following FET input and differential stages 103 and 104 to provide a conditioned input signal to drive a diamond configuration bipolar buffer circuit 108.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

I claim:

1. A buffer circuit, comprising:
   a pair of input voltage amplifiers connected to receive an input voltage signal, each producing a signal representing said input voltage signal;
   a pair of output transistors of opposite conductivity types, connected to receive on their respective bases from said respective pair of input amplifiers said signal representing said input voltage signal, and to develop an output voltage on an interconnection node therebetween;
   a differential amplifier connected to produce an output related to the difference between the input and output voltages, and to apply the difference to the base of one of the output transistors.

2. The buffer circuit of claim 1 wherein said differential amplifier comprises two transistors connected to receive, respectively, the input and output signals on input terminals thereof, and resistance means across which the outputs of said transistors are connected to develop a difference signal for application to said base of said one output transistor.

3. The buffer circuit of claim 1 wherein said pair of input amplifiers each comprise a transistor in series with a current source, said transistor being connected in emitter-follower configuration, and to which said input signal is applied to the respective bases thereof.

4. The buffer circuit of claim 1 wherein the circuit has a unity gain.

5. A buffer circuit, comprising:
   a diamond configuration buffer circuit connected to receive an input signal and to produce an output signal therefrom;
   an operational amplifier connected to receive said input and output signals to provide an output related to the difference between said input and output signals, said operational amplifier being connected to said diamond configuration buffer circuit to maintain a desired gain relationship between the input and output signals.

6. The buffer circuit of claim 5 wherein said operational amplifier maintains a unity gain relationship between said input and output signals.

7. The buffer circuit of claim 6 wherein said operational amplifier is a differential pair of transistors, one receiving said input signal and an other receiving said output signals.

8. A buffer circuit, comprising:
   a diamond configuration buffer circuit having input amplifiers connected to receive an input signal and an output amplifier to produce an output signal;
   a circuit to produce a difference signal between said input and output signals;
   means for applying said difference signal to said diamond configuration buffer circuit to make the input and output signals substantially equal.

9. The buffer circuit of claim 8, wherein said difference signal is applied to an input of said output amplifier.

10. The buffer circuit of claim 9 further comprising a resistor connected between an output of one of said input amplifiers and an input of said output amplifier for applying said difference signal to said output amplifier together with an output of said one of said input amplifiers.

11. A buffer circuit, comprising:
    an FET input amplifier connected to receive an input signal and to produce an output signal representing said input signal;
    an output amplifier, comprising an FET and a bipolar transistor, connected to receive said output signal from said input amplifier and to develop a circuit output signal;
    a differential amplifier comprising FET transistors connected to produce an output related to the difference between the input and output signals, and to apply the difference to the base of said bipolar transistor.

12. The buffer circuit of claim 11 further comprising a resistor to which said output signal representing said input signal from said FET input amplifier is applied, said resistor being connected to the base of said bipolar transistor of said output amplifier, and across which said output related to the difference between the input and output signals produced by said differential amplifier is developed.

13. A buffer circuit, comprising:
    a diamond configuration buffer circuit comprising input and output amplifiers of bipolar transistors,
    a signal input amplifier connected to receive an input signal voltage and to produce a signal representing said input signal voltage, said signal input amplifier comprising at least one field effect transistor;
    a pair of field effect transistors receiving on respective gates thereof an output of said signal input amplifier and an output of said diamond configuration buffer circuit;
    a resistor connected to receive output signals from said pair of field effect transistors on each side thereof, to develop a signal representing the difference between said input and output signals, and to receive an output from said signal input amplifier; and
    a bipolar transistor connected to provide a signal to the input portion of said diamond configuration buffer circuit, the base of said bipolar transistor being connected to said resistor.

14. The buffer circuit of claim 13 wherein said bipolar transistor connected to provide a signal to the input portion of said diamond configuration buffer circuit is connected in an emitter-follower configuration.

15. A buffer circuit, comprising:
a pair of input amplifiers connected to receive an input voltage signal, each producing a signal representing said input voltage signal;
a pair of output transistors of opposite conductivity types, connected to receive on their respective bases from said respective pair of input amplifiers said signal representing said input voltage signal, and to develop an output voltage on an interconnection node therebetween; and
a differential amplifier connected to produce an output related to the difference between the input and output voltages, and to apply the difference to the base of one of the output transistors, said differential amplifier comprising: two transistors connected to receive, respectively, the input and output signal on input terminals thereof, and resistance means across which the outputs of said transistors are connected to develop a difference signal for application to said base of said one output transistor.

16. A buffer circuit, comprising:
a pair of input amplifiers connected to receive an input voltage signal, wherein said pair of input amplifiers each comprise a transistor in series with a current source, said transistor being connected in emitter-follower configuration, and to the base of which said input signal is applied, each of said input amplifiers producing a signal representing said input voltage signal;
a pair of output transistors of opposite conductivity types, connected to receive on their respective bases from said respective pairs of input amplifiers said signal representing said input voltage signal, and to develop an output voltage on an interconnection node therebetween; and
a differential amplifier connected to produce an output related to the difference between the input and output voltages, and to apply the difference to the base of one of the output transistors.

17. A buffer circuit, comprising:
a diamond configuration buffer circuit having input amplifiers connected to receive an input signal and an output amplifier to produce an output signal;
a circuit to produce a difference signal between said input and output signals, wherein said difference signal is applied to an input of said output amplifier to make the input and output signals substantially equal; and
a resistor connected between an output of one of said input amplifiers and an input of said output amplifier for applying said difference signal to said output amplifier together with an output of said one of said input amplifiers.

* * * * *